(12) United States Patent
Kakitani

(10) Patent No.: US 6,577,168 B1
(45) Date of Patent: Jun. 10, 2003

(54) TRACK AND HOLD CIRCUIT

(75) Inventor: Hisao Kakitani, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 13 days.

(21) Appl. No.: 09/680,178

(22) Filed: Oct. 5, 2000

(30) Foreign Application Priority Data

Oct. 8, 1999 (JP) .......................................... 11-288662

(51) Int. Cl.[7] ................................................ H03K 5/00
(52) U.S. Cl. ........................................... 327/94; 327/91
(58) Field of Search ...................................... 327/91–94

(56) References Cited

U.S. PATENT DOCUMENTS

| | | | | |
|---|---|---|---|---|
| 4,862,016 A | * | 8/1989 | Genrich ......................... | 327/94 |
| 5,422,583 A | * | 6/1995 | Blake et al. .................. | 327/94 |
| 6,265,911 B1 | * | 7/2001 | Nairn ........................... | 327/94 |

FOREIGN PATENT DOCUMENTS

| | | |
|---|---|---|
| EP | 0875904 A2 | 11/1998 |
| JP | 3-219724 | 9/1991 |
| JP | 10-312698 | 11/1998 |

OTHER PUBLICATIONS

Y. Sugimoto "A 1.6V 10–bit 20MHz Current–Mode Sample and Hold Circuit" 1998 IEEE ISCAS, vol. 2, pp. 1332–1335, May 1995.

Application Note AN301 of Siliconix Department of TEMIC Semiconductor. Mar. 10, 1997, pp. 1–5.

* cited by examiner

*Primary Examiner*—Kenneth B. Wells

(57) ABSTRACT

A track and hold circuit includes a MOS transistor switch and a holding capacitor, and a bulk potential of the MOS transistor switch is changed in phase with an input signal in order to reduce harmonic distortions.

6 Claims, 5 Drawing Sheets

TRACK AND HOLD CIRCUIT

BACKGROUND OF THE INVENTION

1. Field of the Invention

The present invention relates to a track and hold circuit, and more particularly to a highly accurate, low-distortion track and hold circuit for use in a front end of an analog-to-digital converter.

2. Description of the Related Art

A track and hold circuit is one of basic analog circuits for use at the front end of an analog-to-digital converter, and serves to sample the value of a signal that changes continuously with time, at discrete time intervals. The track and hold circuit causes signal distortion for three reasons, which will be described below using a most fundamental conventional track and hold circuit shown in FIG. 3 of the accompanying drawings.

(A) Variation of Time Required for Charging a Holding Capacitor in a Track Mode:

The illustrated track and hold circuit shown in FIG. 3 comprises two amplifiers 101, 102, a MOS transistor 103 operable as an FET switch, a holding capacitor 104, and a clock source 105. The MOS transistor 103 has a bulk terminal connected to a common potential point (ground). When the MOS transistor 103 is turned on, a base resistance $R_{on}$ depends on a block voltage, i.e., a gate drive voltage $V_\Phi$ of the MOS transistor 103, an input voltage $V_{in}$ applied to the drain thereof, and a threshold voltage $V_{th}$, and is related to these parameters as follows:

$$R_{on}=1/\{\beta(V_\Phi-V_{in}-V_{th})\} \tag{1}$$

Where $\beta$ represents a constant determined by the fabrication process and is expressed by $\beta=\mu C_{ox}W/L$ ($\mu$: mobility, $C_{ox}$: gate oxide film capacitance, W: gate width, L: gate length).

Therefore, when the input voltage $V_{in}$ varies, the base resistance $R_{on}$ also varies, and hence the time constant for time required for charging the holding capacitor 104, which is given by $R_{on} \times C_H$ ($C_H$ is the capacitance of the holding capacitor 104). The signal dependency of the base resistance $R_{on}$ of the MOS transistor 103 which depends on the input voltage $V_{in}$ that is supposed to vary, causes time for charging the holding capacitor 104 to vary, resulting in harmonic distortion.

(B) Variation of Timing Upon Mode Transition:

When the input voltage $V_{in}$ varies, the timing of transition from the track mode to a hold mode varies as shown in FIG. 4 of the accompanying drawings. Specifically, the voltages need to satisfy the condition $V_\Phi \geq V_{in}+V_{th}$ upon transition from the track mode to the hold mode, and need to satisfy the condition $V_\Phi \leq V_{in}+V_{th}$ upon transition from the hold mode to the track mode. Therefore, if the input voltage $V_{in}$ is large, the timing of transition from the track mode to the hold mode is delayed, and the timing of transition from the hold mode to the track mode is advanced. Conversely, if the input voltage $V_{in}$ is small, the timing of transition from the track mode to the hold mode is advanced, and the timing of transition from the hold mode to the track mode is delayed. The signal-dependent timing variation also tends to result in harmonic distortions.

(C) Charge Injection Upon Mode Transition:

As shown in FIG. 5 of the accompanying drawings, when the track mode changes to the hold mode, charges stored under the gate of the MOS transistor 103 are discharged. Specifically, charge Q1 injected into the gate when the MOS transistor 103 is turned on is discharged when the MOS transistor 103 is turned off. Furthermore, charge Q2 stored in a parasitic capacitance $C_{gs}$ between the gate and source of the MOS transistor 103 when the MOS transistor 103 is turned on is discharged when the MOS transistor 103 is turned off. When the MOS transistor 103 is turned off, these charges Q1, Q2 flow into the holding capacitor, possibly causing harmonic distortion. It is known that the charges Q1, Q2 are determined according to the following equations:

$$Q1=-C_{ox}A(V_\Phi-V_{in}-V_{th}) \tag{2}$$

where $C_{ox}$ represents the gate oxide film capacitance per unit area of the MOS transistor 103, A represents the gate area of the MOS transistor 103, $V_\Phi$ represents the clock voltage, $V_{in}$ represents the input voltage $V_{in}$ applied to the drain of the MOS transistor 103, and $V_{th}$ represents the threshold voltage.

$$Q2=-C_{gs}(V_{in}+V_{th}) \tag{3}$$

where $C_{gs}$ represents the gate-to-source capacitance of the MOS transistor 103, and $V_{th}$ represents the threshold voltage. The gate-to-source capacitance $C_{gs}$ depends on the input voltage $V_{in}$ as expressed by the following equation:

$$C_{gs}=C_{gs0}/\{1-(V_\Phi-V_{in}-V_{th})\psi_0\}^{1/2} \tag{4}$$

where $\psi_0$ represents a built-in potential, and $C_{gs0}$ represents the value of the gate-to-source capacitance when $V_{gs}=0$.

As described above, both the charges Q1, Q2 depend on the input voltage $V_{in}$, and are responsible for harmonic distortion. Particularly, the charge Q2 depends nonlinearly on the input voltage $V_{in}$.

Attempts have been made to reduce distortion caused by variations in the input voltage. According to one effort, the gate drive voltage is increased to reduce the dependency of the on resistance upon the input signal, and the MOS transistor is arranged as a CMOS switch to reduce the on resistance. These proposals require a necessary drive voltage to be increased, as is apparent from the characteristics of the MOS transistor, and an increased drive voltage goes against the recent tendency toward lower voltages for circuit design, and results in a large feedthrough of charges. In addition, a high-speed PMOS is needed, and the problem of timing deviations due to variations in the threshold voltage $V_{th}$ remains unsolved. Accordingly, the above proposals have proven unsatisfactory.

An effort has also been made to change the gate voltage depending on the level of the input signal. Examples of such an effort are described in Application Note, dated Mar. 10, 1997, relating to AN301, of Siliconix division of TEMIC Semiconductors, and Japanese Patent No. 2833070 (Japanese Patent Laid-open No. Heisei 3-219724). However, these circuit arrangements require a voltage source ranging from 10 to 15 volts, and do not lend themselves to a system LSI device which needs a lower operational voltage, though they can be used for measuring instruments. In addition, the circuit arrangements have a complex driver circuit.

It has also been proposed to use a dummy switch to reduce the charge injection. For example, reference should be made to Japanese Patent Laid-open No. Heisei 10-312698. According to the proposed scheme, another MOS transistor is inserted between the MOS transistor 103 and the amplifier 101 at the output stage or ground, for absorbing at least part of the charge flowing into the holding capacitor. One problem with the proposal is that the timing to drive the added MOS transistor needs to be controlled finely, and a more essential problem is that it is difficult to handle the charge injection quantitatively.

SUMMARY OF THE INVENTION

It is therefore an object of the present invention to provide a track and hold circuit which can operate at a lower voltage and can reduce distortions in waveforms that are held by the circuit.

According to the present invention, the signal distortion of a track and hold circuit is lowered by controlling a bulk potential or substrate potential of a MOS transistor switch.

According to the present invention, there is provided a track and hold circuit which includes a MOS transistor switch and a holding capacitor, the arrangement being such that a bulk potential of the MOS transistor switch is changed in phase with an input signal.

According to the present invention, there is also provided a track and hold circuit which includes a MOS transistor switch for selectively transmitting and blocking an input voltage depending on a gate voltage thereof, a holding capacitor electrically connected to the MOS transistor switch, for generating an output voltage, and a level shifting circuit for supplying a potential depending on an input signal to a bulk terminal of the MOS transistor switch. The track and hold circuit further may include an amplifier having an input terminal and an output terminal, and a terminal of the holding capacitor which is connected to the MOS transistor switch may be connected to the input terminal of the amplifier, and the output terminal of the amplifier may be used as an output terminal of the track and hold circuit. The potential supplied to the bulk terminal of the MOS transistor switch is preferably in phase with the input signal. A buffer amplifier may be connected between the MOS transistor switch and an input terminal.

According to the present invention, there is further provided a track and hold circuit comprising an amplifier having an inverting input terminal for being supplied with an input signal from an input signal terminal in a track mode, a holding capacitor having a terminal electrically connected to an output terminal of the amplifier, and another terminal electrically connected to the inverting input terminal of the amplifier in a hold mode, a first MOS transistor switch connected between the other terminal of the holding capacitor and the inverting input terminal, a second MOS transistor switch connected between the other terminal of the holding capacitor and a common potential point, a third MOS transistor switch connected between the input signal terminal and the inverting input terminal, a fourth MOS transistor switch connected between the input signal terminal and the common potential point, a first level shifting circuit having an output terminal connected to bulk terminals of the first and second MOS transistors, and a second level shifting circuit having an output terminal connected to bulk terminals of the third and fourth MOS transistors.

The first level shifting circuit may have an input terminal connected to the output terminal of the amplifier via a capacitor having substantially the same capacitance as the holding capacitor. Alternatively, the first level shifting circuit may have an input terminal connected to a node shared by the first MOS transistor switch and the second MOS transistor switch.

The first level shifting circuit may supply a potential variation with a phase opposite to that of the input signal to the bulk terminals of the first and second MOS transistor switches, and the second level shifting circuit may supply a potential variation in phase with the input signal to the bulk terminals of the third and fourth MOS transistor switches.

DETAILED DESCRIPTION OF THE PREFERRED EMBODIMENTS

Figure 1:
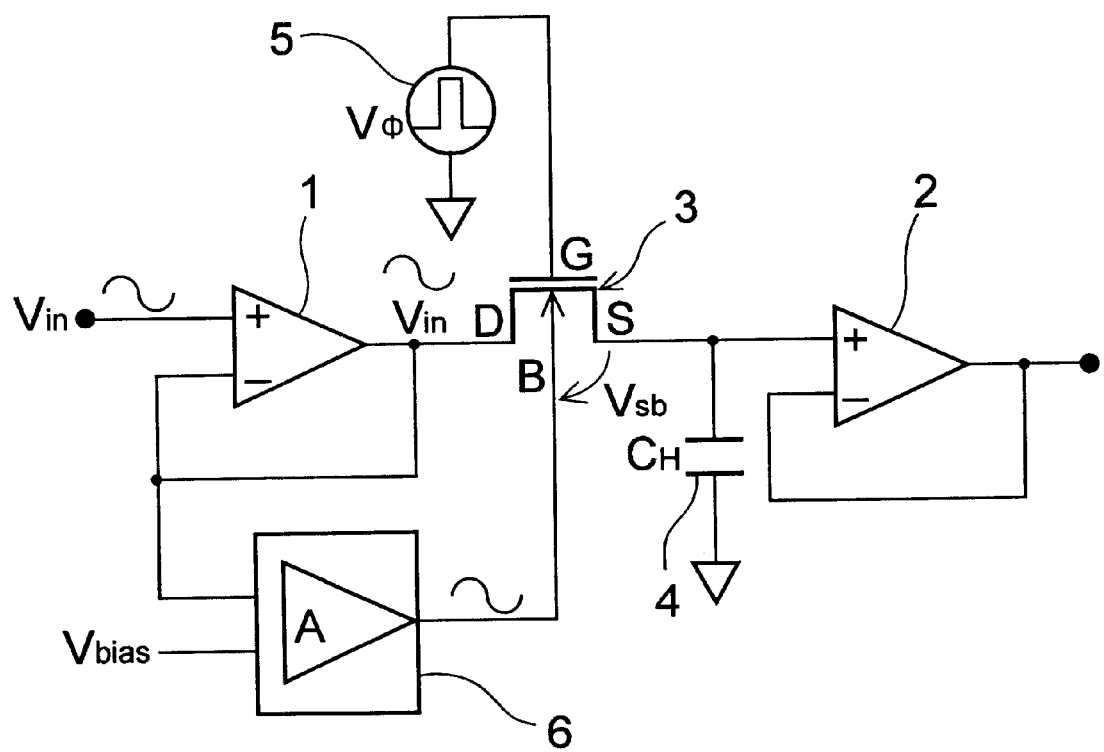
FIG. 1 is a circuit diagram of a track and hold circuit according to a first embodiment of the present invention.

FIG. 1 shows a track and hold circuit according to a first embodiment of the present invention. As shown in FIG. 1, the track and hold circuit according to the first embodiment comprises a buffer amplifier 1, an output-stage amplifier 2, a MOS transistor 3 (only one shown) functioning as an FET switch between the amplifiers 1, 2, a clock source 5 connected to the gate of the MOS transistor 3, and a level shifting circuit 6 for applying a biased voltage output in phase with an input signal voltage $V_{in}$ to a bulk terminal of the MOS transistor 3. The level shifting circuit 6 may basically be in the form of a simple amplifier supplied with the input signal voltage $V_{in}$. When a biasing voltage $V_{bias}$ (which may be zero) is applied to the level shifting circuit 6, the level shifting circuit 6 can produce a voltage suitable for being applied to the bulk terminal of the MOS transistor 3.

The reasons why the track and hold circuit shown in FIG. 1 can achieve low distortion will be described below. It is known that a threshold voltage $V_{th}$ of a MOS transistor varies depending on the voltage ($V_{sb}=V_s-V_b$) between the source and the bulk (substrate). Generally, the threshold voltage $V_{th}$ is expressed according to the following equation:

$$V_{th}=V_{tho}+\gamma\{(V_{sb}+2|\Phi|)^{1/2}-2|\Phi|\}^{1/2}\} \tag{5}$$

where $V_{tho}$ represents a constant referred to as an initial threshold voltage, $\Phi$ represents a work function, and $\gamma=(2q\epsilon N_a)^{1/2}/C_{ox}$ where q is the electron charge, $\epsilon$ is the permittivity of silicon, and $N_a$ is the doping density of p-type substrate, and $C_{ox}$ the gate oxide film capacitance.

Stated roughly, a change $\Delta V_{th}$ of the threshold voltage $V_{th}$ from a suitable constant can be considered to be proportional to the square root of the voltage $V_{sb}$. The input voltage $V_{in}$ and a negative value $-\Delta V_{th}$ of the threshold voltage change $\Delta V_{th}$ can be substantially equalized to each other by controlling the voltage applied to the bulk terminal in phase with the input voltage $V_{in}$. Since the threshold voltage change $\Delta V_{th}$ is related to the square root of the voltage $V_{sb}$, the input voltage $V_{in}$ and the threshold voltage change $\Delta V_{th}$ do not completely cancel each other simply by linearly changing the voltage $V_{sb}$ in proportion to the input voltage $V_{in}$. However, it is known from a simulation and measured data of a circuit actually constructed according to the present invention that the threshold voltage change $\Delta V_{th}$ can be varied depending on the input voltage $V_{in}$ to a degree approximately sufficient to cancel out the effect of the input voltage $V_{in}$.

For example, when the negative threshold voltage change $-\Delta V_{th}$ is changed in phase with the input voltage $V_{in}$ to the same magnitude as the input voltage $V_{in}$, they cancel out each other, and the on resistance $R_{on}$ of the MOS transistor 3 is substantially independent of variations in the input voltage $V_{in}$, as can readily be understood from the equation (1).

Since the timing for tracking and holding is based on $V_{in}+V_{th}$ as described above, its dependency on the input signal can be canceled out by changing the voltage $V_{sb}$ in opposite phase to the input voltage $V_{in}$ exactly in the same manner as with the on resistance of the MOS transistor 3.

The problem of variations in the injected charge upon transition from the track mode to the hold mode can similarly be reduced. Specifically, the term $V_{in}+V_{th}$ appears in each of the equations (2) and (3) relative to the charges Q1, Q2 and the equation (4) relative to $C_{gs}$, and $V_{in}$ does not appear in the other equations. Therefore, the dependency of the injected charge on the input voltage upon transition from the track mode to the hold mode is reduced because variations in $V_{in}$ and $-\Delta V_{th}$ cancel out each other.

Figure 2:
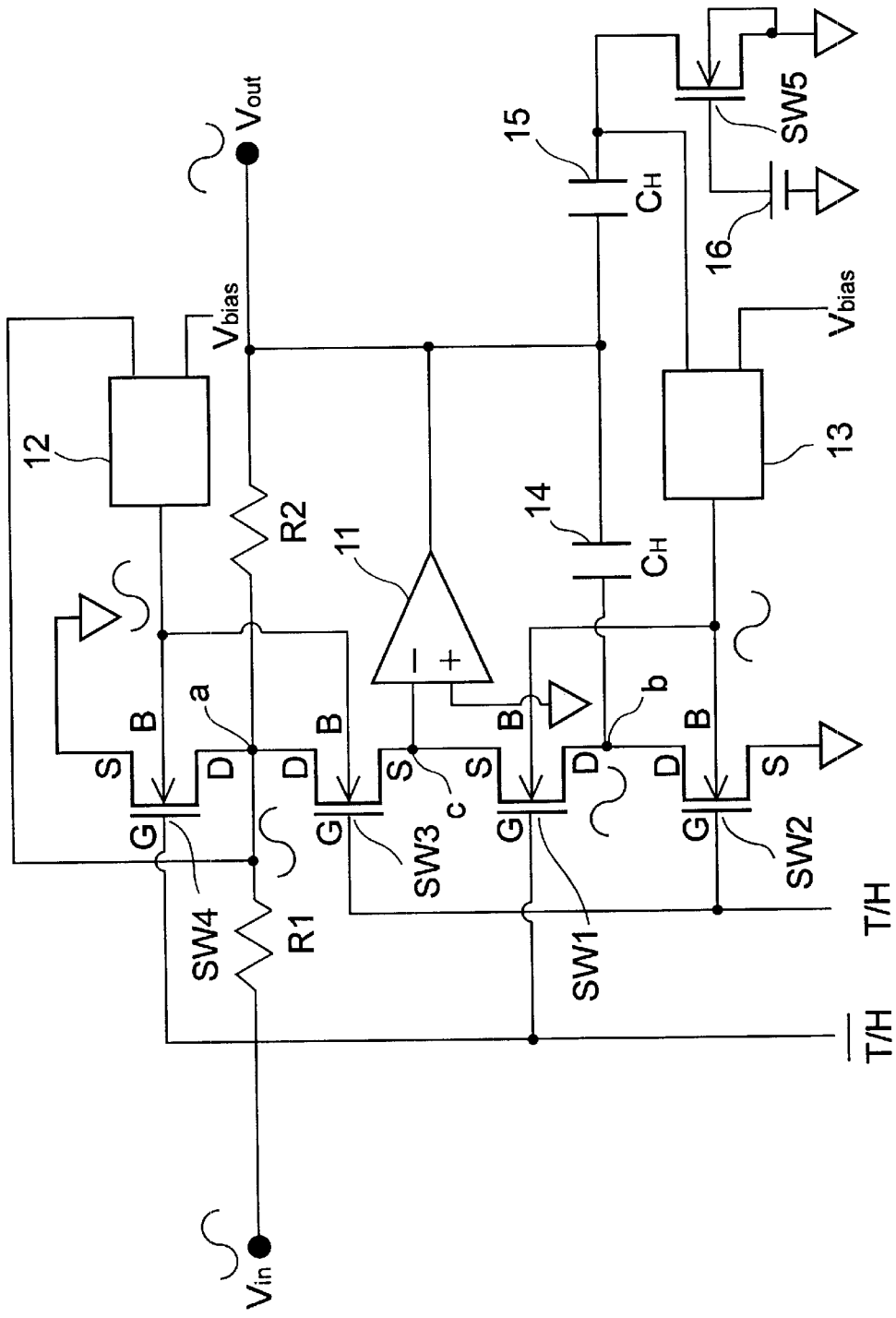
FIG. 2 is a circuit diagram of a track and hold circuit according to a second embodiment of the present invention.
Figure 3:
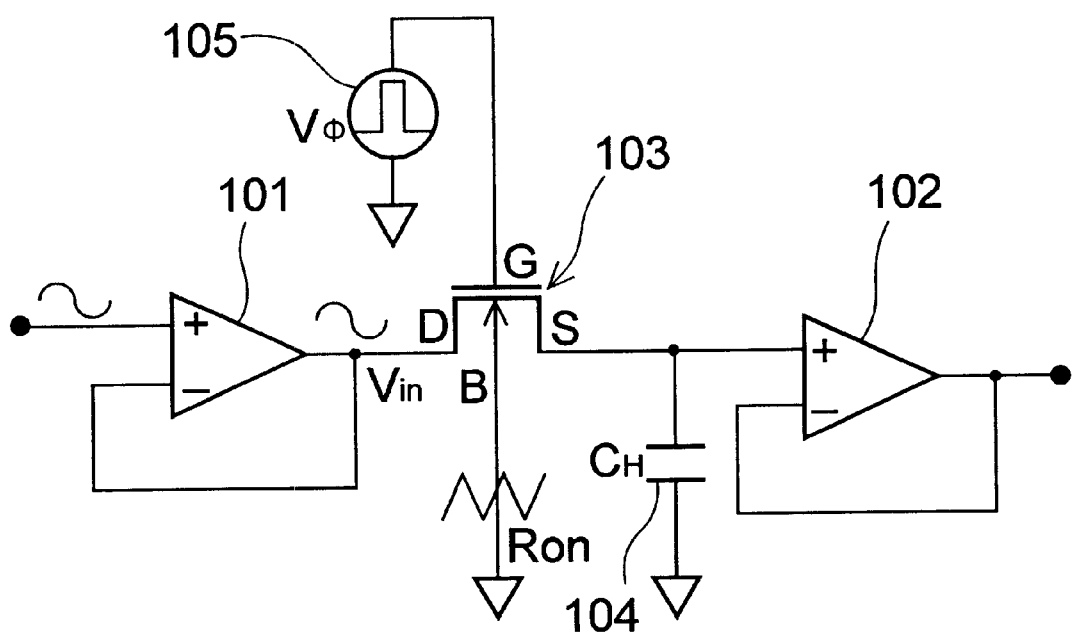
FIG. 3 is a circuit diagram of a conventional track and hold circuit.
Figure 4:
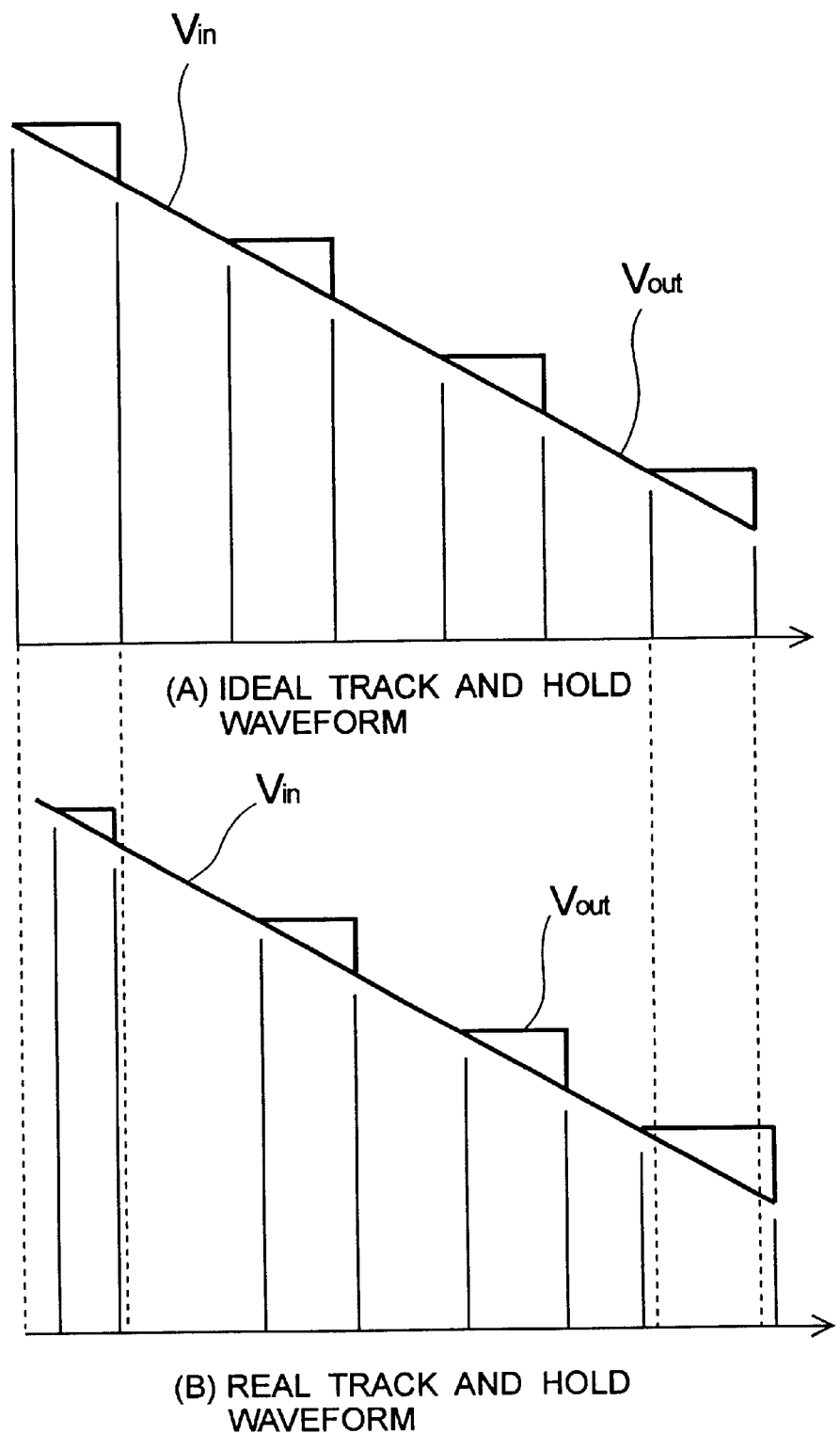
FIG. 4 is a graph showing ideal and real timing variations of a track and hold circuit.
Figure 5:
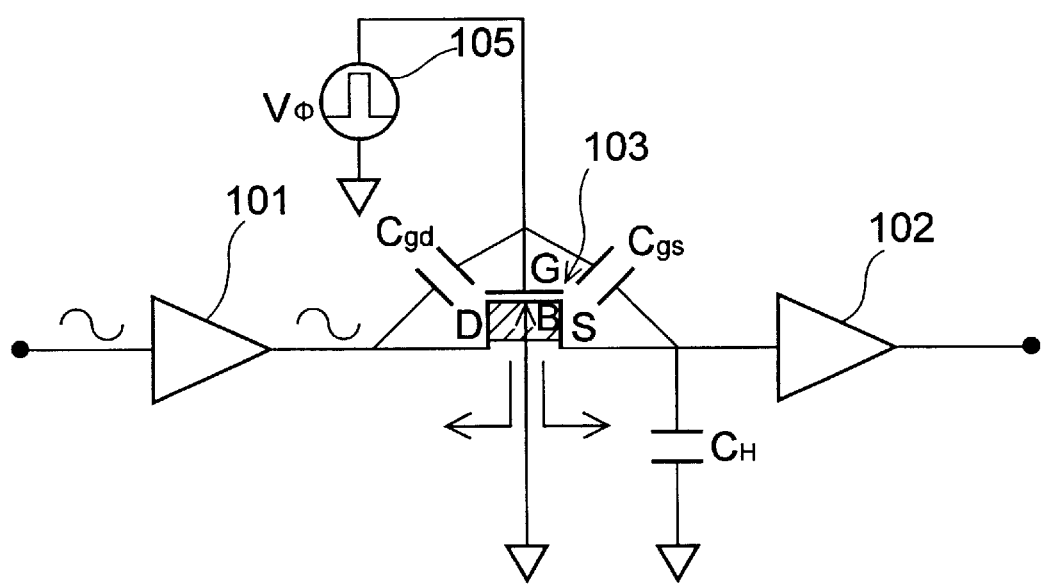
FIG. 5 is a circuit diagram illustrative of the charge injection and parasitic capacitance of a MOS transistor in the conventional track and hold circuit shown in FIG. 3.

A track and hold circuit according to a second embodiment of the present invention will be described below. FIG. 2 shows the track and hold circuit according to the second embodiment. According to the second embodiment, the principles of the present invention are applied to an integral track and hold circuit. In the integral track and hold circuit, since the voltages at nodes a, b shown in FIG. 2 vary as the frequency increases, these nodes are monitored to control the voltage at the bulk terminals of MOS transistors in phase with the input signal.

As shown in FIG. 2, the track and hold circuit mainly comprises four MOS transistors SW1, SW2, SW3, SW4 each functioning as an FET switch, an amplifier 11, and a holding capacitor 14 having a capacitance $C_H$. According to the present invention, the track and hold circuit additionally includes level shifting circuits 12, 13 for varying the substrate voltages of the FET switches. The level shifting circuits 12, 13 generate a signal by adding a waveform which is in phase with and corresponds substantially to an input signal $V_{in}$ to a biasing voltage $V_{bias}$ which is of a zero or a non-zero constant value. The level shifting circuits 12, 13 may be implemented by amplifiers that are biased by the voltage $V_{bias}$. The level shifting circuit 12 has an output terminal connected to the bulk terminals of the MOS transistors SW3, SW4, and the level shifting circuit 13 has an output terminal connected to the bulk terminals of the MOS transistors SW1, SW2. The level shifting circuit 12 has an input terminal connected to the node a and coupled to an input signal terminal via a resistor R1.

The level shifting circuit 13 is associated with a capacitor 15 which has the same capacitance as the holding capacitor 14 that is a characteristic component of the track and hold circuit, and a MOS transistor SW5 corresponding to the switch SW2. Inasmuch as the voltage at the node b is sensitive to voltage variations across the holding capacitor 14, the capacitor 15 and the MOS transistor or FET switch SW5 are provided as a buffer circuit for avoiding problems at high frequencies. A certain voltage 16 is applied to the gate of the FET switch SW5. An input signal applied to the level shifting circuit 13 is supplied from the output terminal of the amplifier 11 via the capacitor 15. Functionally, however, the level shifting circuit 13 receives an input voltage from the node b and outputs a voltage in phase with the voltage at the node b. This buffer circuit is not required in applications for lower frequencies, where the voltage from the node b may directly be applied to the level shifting circuit 13.

The circuit arrangement shown in FIG. 2 will be described in greater detail below. The first and second MOS transistors SW1, SW2 are connected in series between the inverting input terminal c of the amplifier 11 and a common potential point (ground), and the holding capacitor 14 is connected between the output terminal of the amplifier 11 and the MOS transistors SW1, SW2. The MOS transistors SW1, SW2 have drains connected to each other at the node b. The MOS transistor SW1 has a source connected to the inverting input terminal c of the amplifier 11. The MOS transistor SW2 has a source connected to the common potential point.

The third and fourth MOS transistors SW3, SW4 are connected directly between the inverting input terminal c of the amplifier 11 and the common potential point. The MOS transistors SW3, SW4 have drains connected to each other at the node a. The MOS transistor SW3 has a source connected to the inverting input terminal c of the amplifier 11. The MOS transistor SW4 has a source connected to the common potential point. The MOS transistors SW2, SW3 have gates driven by a track and hold clock (T/H), and the MOS transistors SW1, SW4 have gates driven by an inverted track and hold clock (T/H with an overbar). These clocks are generated by an external circuit.

In the track mode, the MOS transistors SW2, SW3 are turned on, the MOS transistors SW1, SW4 are turned off, and the input voltage $V_{in}$ is outputted as an inverted signal having an absolute value depending on the gain of the amplifier 11. In the hold mode, the MOS transistors SW1, SW4 are turned on, the MOS transistors SW2, SW3 are turned off, and the holding capacitor 14 holds the voltage of an inverted output signal at the time the MOS transistor SW2 is turned off. Since the MOS transistor SW4 is turned on, an input current under the input voltage $V_{in}$ flows to the common potential point and is separated from the output from the amplifier 11. In FIG. 2, waveform symbols similar to the waveform symbol at the input signal terminal indicate terminals where a potential in phase with the input signal $V_{in}$ appears, and waveform symbols different from the waveform symbol at the input signal terminal indicate terminals (the node b, the output terminal $V_{out}$, and the output terminal of the level shifting circuit 13) where a potential in opposite phase to the input signal $V_{in}$ appears.

According to the present invention, the mechanism described above is able to reduce causes of distortion. For example, when the frequency of the input signal $V_{in}$ increases, the current for charging the holding capacitor 14 increases, developing a voltage drop across the on resistance of the MOS transistor SW2 for thereby changing the holding timing. According to the present invention, the level shifting circuit 13 adjusts the bulk potential for the MOS transistors SW1, SW2 operating in pair and the MOS transistors SW3, SW4 operating in pair depending on the voltages at the nodes a, b, i.e., the drain voltages of the MOS transistors SW1, SW3, for thereby reducing causes of distortion. The mechanism of eliminating distortion is the same as with the circuit shown in FIG. 1.

A SPICE simulation was conducted on the circuit shown in FIG. 1 to inspect how second and third harmonic distortion was reduced as compared with the conventional arrangement. An input signal was composed of an AC component of 0.5 V at 100 kHz in a sine wave and a DC component of 1 V. The capacitance $C_H$ was 100 pF. The biasing voltage $V_{bias}$ was –2.0 V. The DC component of the bulk terminal voltage was –2.0 V. In order to determine distortion upon sampling, the gate voltage was 5 V. In order to determine distortion upon holding, the sampling frequency was 1 M samples/second, and the gate voltage varied between 5 V and 0 V. In a comparative example, the bulk terminal was connected to the common potential terminal. The results of the inspection are set forth in Table 1 shown below.

TABLE 1

|  |  | Second harmonic distortion | Third harmonic distortion |
|---|---|---|---|
| Upon sampling | Comparative example | −62 dBc | −72 dBc |
|  | Inventive example | −73 dBc | −87 dBc |
| Upon holding | Comparative example | −58 dBc | −65 dBc |
|  | Inventive example | −70 dBc | −73 dBc |

The circuit shown in FIG. 2 was actually constructed, and second distortion and third distortion thereof in the hold mode were measured when the bulk terminals were connected to the common potential point (comparative example) and when the bulk potential was adjusted by the level shifting circuits 12, 13 (inventive example). The input signal was of ±5 V at 100 kHz in a sine wave, the capacitance $C_H$ was 100 pF, and distortion was sampled at a rate of 1 M samples/second (the sampling frequency was 1 M Hz). The results of the measurement are set forth in Table 2 shown below.

TABLE 2

|  | Second harmonic distortion | Third harmonic distortion |
|---|---|---|
| Comparative example | −71 dBc | −74 dBc |
| Inventive example | −82 dBc | −90 dBc |

In the inventive example, the DC linearity, the frequency band, and the noise floor were the same as those in the comparative example. According to the present invention, therefore, the track and hold circuit is capable of improving harmonic distortion without undesirable side effects.

According to the present invention, the track and hold circuit is capable of improving harmonic distortion using a simple level shifting circuit without sacrificing the DC linearity, the frequency band, and the noise floor.

It should be understood that the foregoing description is only illustrative of the invention. The preferred embodiment examples of the present invention presented herein can be modified or revised by those skilled in the art without deviating from the invention. Consequently, the scope of the present invention is intended to encompass all such modifications and variances which fall within the appended claims. For example, the FET switches are not limited to transistors of certain types, and the number of transistors used may be changed depending on the application or for improvements.

The entire disclosure of Japanese Patent Application No. 288662/1999 filed on Oct. 8, 1999 including the specification, claims, drawings, and summary are incorporated herein by reference in its entirety.

What is claimed is:

1. A track and hold circuit comprising:
   a MOS transistor switch;
   a holding capacitor, the arrangement being such that a bulk potential of the MOS transistor switch is changed in phase with an input signal; and
   an amplifier having an input terminal and an output terminal, wherein a terminal of the holding capacitor which is connected to the MOS transistor switch is connected to the input terminal of the amplifier, and the output terminal of the amplifier is used as an output terminal of the track and hold circuit.

2. A track and hold circuit comprising:
   a MOS transistor switch;
   a holding capacitor, the arrangement being such that a bulk potential of the MOS transistor switch is changed in phase with an input signal; and
   a buffer amplifier connected between the MOS transistor switch and an input terminal.

3. A track and hold circuit comprising:
   an amplifier having an inverting input terminal for being supplied with an input signal from an input signal terminal in a track mode;
   a holding capacitor having a terminal electrically connected to an output terminal of the amplifier, and another terminal electrically connected to the inverting input terminal of the amplifier in a hold mode;
   a first MOS transistor switch connected between the other terminal of the holding capacitor and the inverting input terminal;
   a second MOS transistor switch connected between the other terminal of the holding capacitor and a common potential point;
   a third MOS transistor switch connected between the input signal terminal and the inverting input terminal;
   a fourth MOS transistor switch connected between the input signal terminal and the common potential point;
   a first level shifting circuit having an output terminal connected to bulk terminals of the first and second MOS transistors; and
   a second level shifting circuit having an output terminal connected to bulk terminals of the third and fourth MOS transistors.

4. A track and hold circuit according to claim 3, wherein the first level shifting circuit has an input terminal connected to the output terminal of the amplifier via a capacitor having substantially the same capacitance as the holding capacitor.

5. A track and hold circuit according to claim 3, wherein the first level shifting circuit has an input terminal connected to a node shared by the first MOS transistor switch and the second MOS transistor switch.

6. A track and hold circuit according to claim 3, wherein the first level shifting circuit supplies a potential variation with a phase opposite to that of the input signal to the bulk terminals of the first and second MOS transistor switches, and the second level shifting circuit supplies a potential variation in phase with the input signal to the bulk terminals of the third and fourth MOS transistor switches.

* * * * *